United States Patent [19]
Lee

[11] Patent Number: 5,478,757
[45] Date of Patent: Dec. 26, 1995

[54] METHOD FOR MANUFACTURING PHOTODETECTOR USING A POROUS LAYER

[75] Inventor: Ming-Kwei Lee, Kaohsiung, Taiwan

[73] Assignee: National Science Council, Taipei, Taiwan

[21] Appl. No.: 289,448

[22] Filed: Aug. 12, 1994

[51] Int. Cl.⁶ .................................................. H01L 31/18
[52] U.S. Cl. ............................ 437/2; 437/230; 437/235
[58] Field of Search .............................. 437/2, 3, 230, 437/235

[56] References Cited

U.S. PATENT DOCUMENTS 4,522,663  6/1985  Ovshinsky et al. ....................... 437/2
5,374,581  12/1994  Ichikawa et al. ...................... 437/235

*Primary Examiner*—Chandra Chaudhari
*Attorney, Agent, or Firm*—Lowe, Price, LeBlanc & Becker

[57] ABSTRACT

The present invention is related to a method for manufacturing a photodetector which comprises steps of: (a) preparing a substrate having a back surface; (b) applying a first metal layer on the back surface; (c) annealing the substrate coated with the first metal layer in an inert gas atmosphere; (d) applying an anti-corrosion layer on the first metal layer; (e) immersing the anti-corrosion layer-applied substrate in a solution; (f) eroding the anti-corrosion layer-applied substrate to obtain a porous layer thereon; and (g) applying a thin film layer of a second metal to an upper surface of the porous layer to obtain the photodetector. The present photodetector has a wider frequency band and a higher sensitivity than conventional ones and the present manufacturing method is simple and economical.

24 Claims, 4 Drawing Sheets

5,478,757

METHOD FOR MANUFACTURING PHOTODETECTOR USING A POROUS LAYER

FIELD OF THE INVENTION

This invention relates generally to a method for manufacturing a photodetector, and more particularly to a method for manufacturing a high sensitivity and broad band porous silicon photodetector.

BACKGROUND OF THE INVENTION

A photodetector is a device converting a photo signal into an electronic signal and extensively used in various fields, e.g. communication, computer engineering, controlling engineering and medical engineering etc. However, different photodetectors are needed for different uses, and also are needed to be altered according to the requirements of different photo signal frequencies. The detectable frequency band of conventional photodetectors is so narrow that a required photo response cannot be obtained when they are applied to a case needing a wide band or a frequency near an cut-off frequency of the used photodetector. This defect can be obviated by parallel connection of photodetectors with compensating frequency ranges.

The frequency range of a photodetector depends on a semiconductor material it uses. For example, silicon is used in a photodetector having a frequency range of 0.8–0.9 μm, and a Ge, InGaAs or InGaAsP is used in a photodetector having a detectable frequency range of 1.0–1.6 μm, etc. The reason why a semiconductor has a frequency range of a photodetector is that a semiconductor material with a specific band gap accepts a specific frequency band. Therefore, if a certain frequency or wavelength is needed, a photodetector with a certain semiconductor material is used; and if a wide frequency range is needed, several photodetectors with different semiconductor materials are used.

The shortcomings of the conventional photodetectors are lacking of flexibility m circuitry, assembly and application, and having troubles m the match among the voltage, frequency and circuit.

SUMMARY OF THE INVENTION

An objective of the present invention is to offer a simple and economical method to manufacture a photodetector.

Another objective of the present invention is to offer a method to manufacture a photodetector having direct band gap and thus high optoelectronic conversion efficiency.

Another objective of the present invention is to offer a method to manufacture a photodetector having a wide frequency range.

Another objective of the present invention is to offer a method to manufacture a photodetector having a high photo sensity in the range of 300–1000 nm.

Another objective of the present invention is to offer a method to manufacture a photodetector having a simpler circuitry and a simpler controlling process.

In accordance with the present invention, a method for manufacturing a photodetector comprises steps of: (a) preparing a substrate having a back surface; (b) applying a first metal layer on the back surface; (c) annealing the substrate coated with the first metal layer in an inert gas atmosphere; (d) applying an anti-corrosion layer on the first metal layer; (e) immersing the anti-corrosion layer-applied substrate in a solution; (f) eroding the anti-corrosion layer-applied substrate to obtain a porous layer thereon; and (g) applying a thin film layer of a second metal onto an upper surface of the porous layer to obtain the photodetector.

In accordance with another aspect of the present invention, the substrate is made of one selected from a group consisting of Si, Ge, and SiGe.

In accordance with another aspect of the present invention, the substrate is P type.

In accordance with another aspect of the present invention, the substrate serves as an anode.

In accordance with another aspect of the present invention, the substrate has a resistivity of about 25~45 Ω-cm.

In accordance with another aspect of the present invention, a crystal direction of the substrate is (100).

In accordance with another aspect of the present invention, the step (b) is executed by thermal evaporation.

In accordance with another aspect of the present invention, the first metal layer is made of aluminum and the second metal layer is made of gold or aluminum.

In accordance with another aspect of the present invention, the inert gas is nitrogen.

In accordance with another aspect of the present invention, the step (c) is executed at about 350° C.~550° C. for about 10 minutes.

In accordance with another aspect of the present invention, the anti-corrosion layer is made of black wax.

In accordance with another aspect of the present invention, the step (d) is executed by coating.

In accordance with another aspect of the present invention, the solution is a 5% hydrofluoric acid aqueous solution.

In accordance with another aspect of the present invention, the step (f) is executed under a current density of about 5 mA/cm$^2$ for about 15 minutes.

In accordance with another aspect of the present invention, wire sizes of the porous layer are different.

In accordance with another aspect of the present invention, the step (f) is excuted by etching.

In accordance with another aspect of the present invention, the step (g) is executed by thermal evaporation.

In accordance with another aspect of the present invention, a step of depriving the anti-corrosion layer following the step (f) or (g) is excuted.

In accordance with another aspect of the present invention, a photodetector manufactured by the method comprises: a substrate having an upper surface and the back surface; a first metal layer provided on the back surface of the substrate; a porous layer provided on the upper surface of the substrate; and a second metal layer provided on an upper surface of the porous layer.

In accordance with another aspect of the present invention, an apparatus adapted to be energized by a power current source and utilized by the method comprises: an anode; a cathod corresponding to the anode; an electrolyte in which the anode and the cathod are immersed; and a teflon beaker in which the electrolyte, the anode, and the cathod are loaded.

In accordance with another aspect of the present invention, the apparatus further comprises a teflon holder for holding the anode and the cathode.

The present invention may best be understood through the following description with reference to the accompanying drawings, in which:

DETAILED DESCRIPTION OF THE PREFERRED EMBODIMENT

An ideal photodetector is one with a semiconductor material which has a wide distribution in band gap, i.e. has a high band gap as well as a low band gap, and has a high sensitivity for various frequencies. A photodetector with widely distributed band gaps has a higher optoelectronic conversion efficiency when detecting various optical signals with both long and short wavelengths.

A porous Si differs from a general Si in the increase of the photo quantum efficiency caused by the conversion from an indirect band gap to a direct band gap after it is etched through an electrolyte. Besides, the porous Si has a certain distribution in wire size, and according to the quantum confinement theory, different wire sizes correspond to different band gaps. Therefore, a porous Si has an advantage of wide band gap distribution, i.e. it can detect various optical signals in different frequency or wavelength ranges. Furthermore, owing to the porous characteristic, the primary reflection rate of the porous Si is lower than that of the general Si, and thus the photo sensitivity of the porous Si without adding any anti-reflection film is also higher than that of the general Si without adding any anti-reflection film.

The present invention will now be described more specifically with reference to the following embodiments. It is to be noted that the following descriptions of preferred embodiments of this invention are presented herein for the purpose of illustration and description only; it is not intended to be exhaustive or to be limited to the precise form disclosed.

Figure 1:
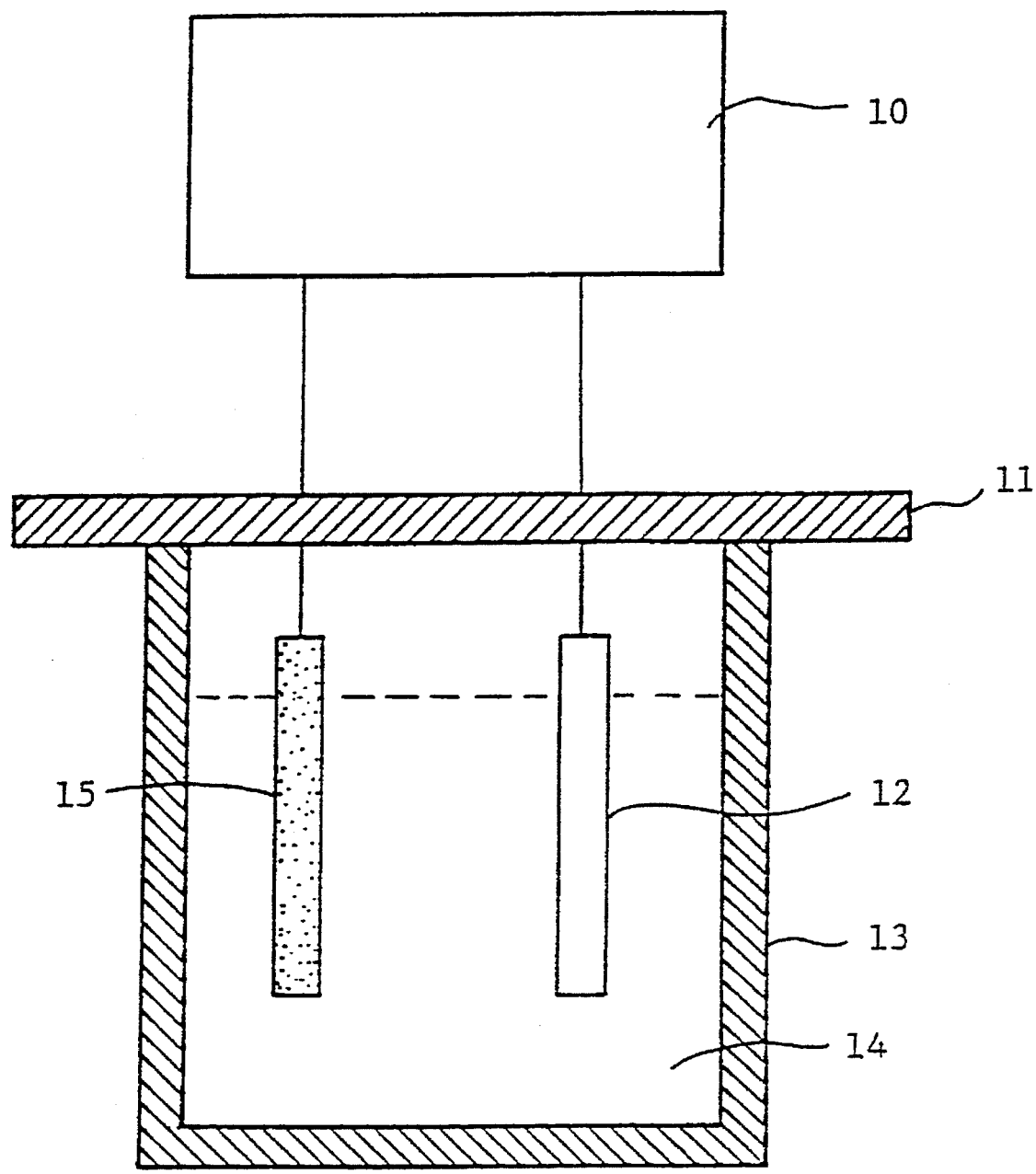
FIG. 1 is a schematic view of an anode eroding apparatus for a photodetector according to this invention.

FIG. 1 shows an anode eroding apparatus according to this invention comprising a power current source 10, a teflon holder 11, a thermal evaporatinum cathode 12, and a teflon beaker 13 containing an electrolyte 14 of hydrofluoric acid aqueous solution or a hydrofluoric acid-containing solution such as a hydrofluoric acid and acetic acid mixing solution. A wax-coated Si substrate 15 is immersed into the electrolyte 14 to proceed an eroding process.

Take a (100) Si having a resistivity of about 25–45 Ω-cm as a substrate and provide Al to the back surface of the Si substrate by thermal evaporation. The Si substrate is then subjected to an annealing process for about 10 minutes at a temperature of about 350°~550° C. After being coated with wax, the Si substrate is placed into a 5% hydrofluoric acid aqueous solution to proceed an anode eroding process for about 15 minutes, wherein the input current for eroding the Si substrate is kept at a current density of about 5 mA/cm², to obtain a porous Si layer on the Si substrate. The aforementioned step is followed by a step of depriving said wax and a step of providing a thin film of gold or aluminum by thermal evaporation to cause a Schottky contact which is beneficial for current collection. By this way, a photodetector is obtained.

Figure 2:
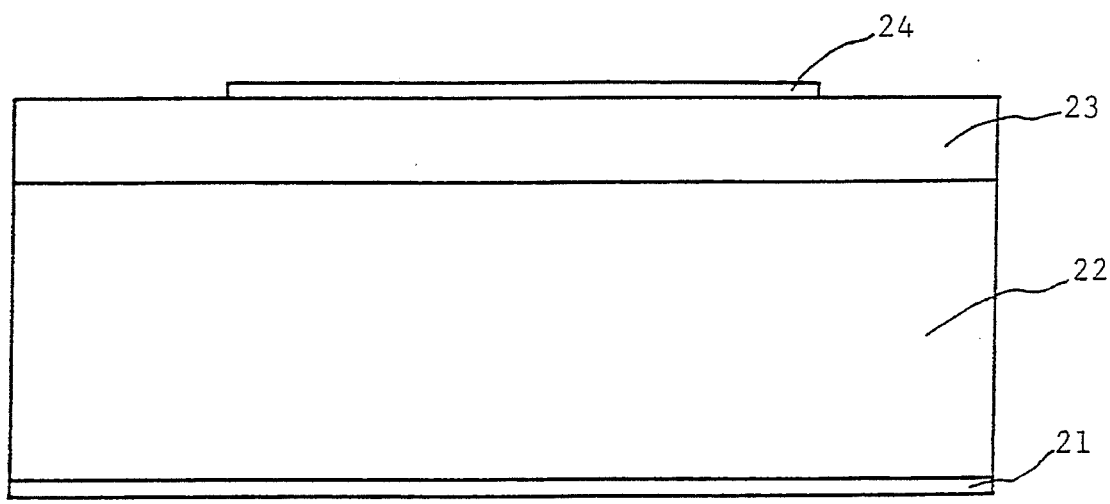
FIG. 2 is a cross-sectional view of a porous Si photodetector according to this invention.

The structure of the obtained porous Si device, as shown in FIG. 2, comprises a Si substrate 22, an Al layer 21 on the back surface of the Si substrate 22, a porous Si layer 23 on the top surface of the Si substrate 22, and an Au or an Al layer 24 on the porous Si layer 23.

Figure 3:
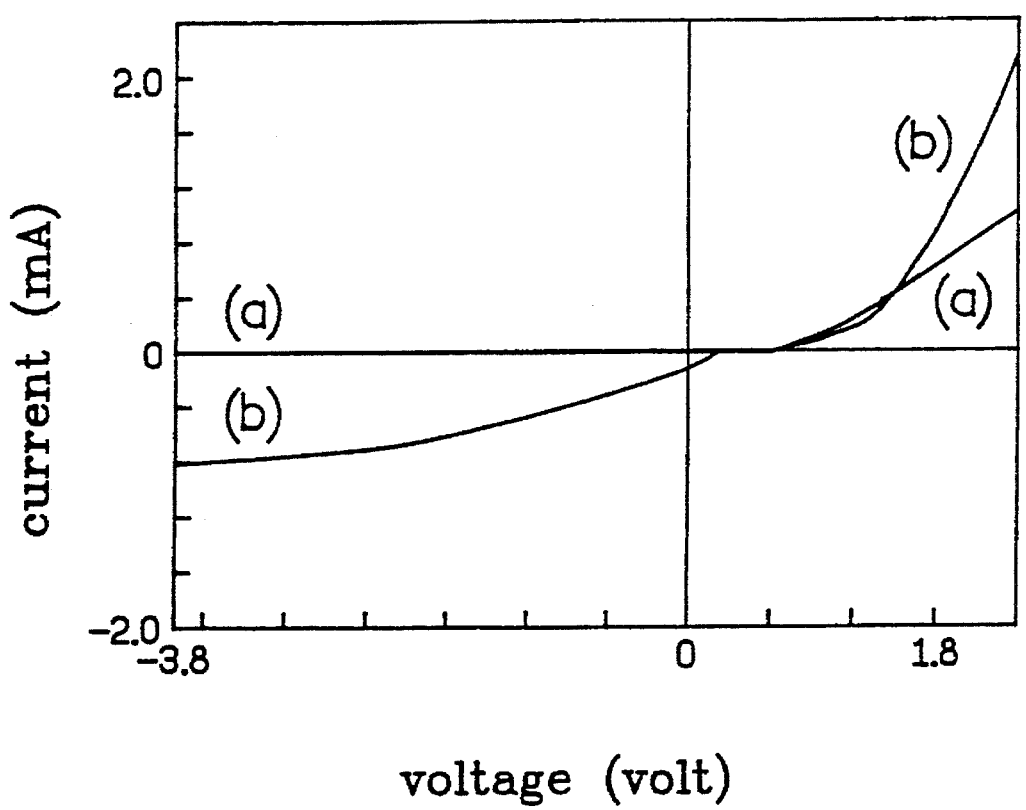
FIG. 3 is voltage vs. current plots of a photodetector respectively under a dark room and an illuminated environment according to this invention.
Figure 4:
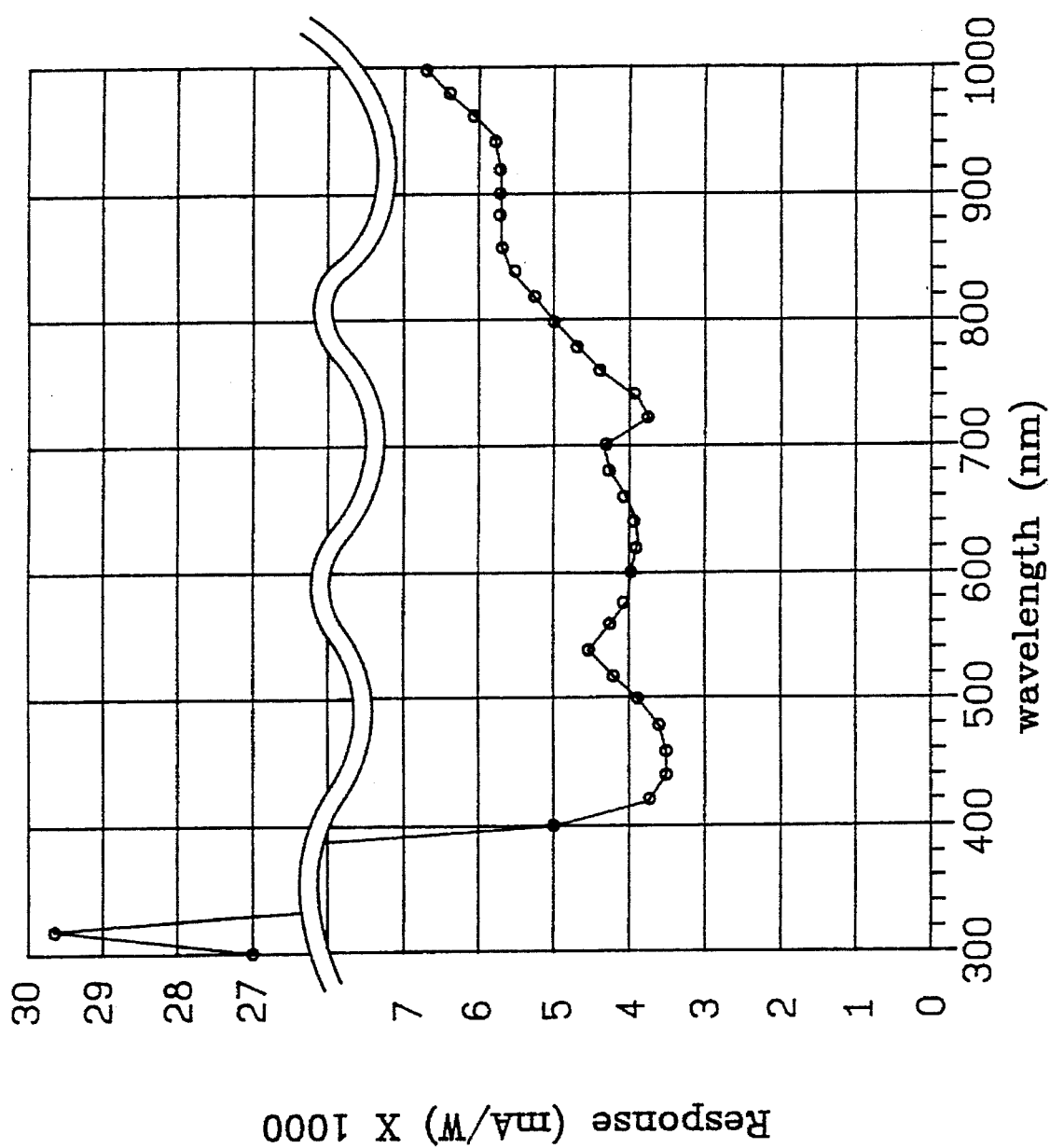
FIG. 4 is a response vs. wavelength plot of a photodetector under an operation voltage of −2 V and detected wavelengths of 300~1000 nm according to this invention.

FIGS. 3 & 4 are experimental data of the present photodetector. FIG. 3 is voltage vs. current plots of the present photodetector respectively under a dark room and an illuminated environment according to this invention; and FIG. 4 is a response vs. wavelength plot of the present photodetector under an operation voltage of −2 V and detected wavelengths of 300~1000 nm according to this invention. From the data, it can be seen that the present photodetector has a high sensitivity for all the wavelength range of 300~1000 nm.

A porous Si is a novel material having a direct band gap. It is produced by eroding a surface of silicon to be porous. The band gap thereof will thus be transformed from an indirect one into a direct one through a folding effect. The band gap is a function of its corresponding wire size and the wire size of the porous Si treated and obtained by the aforementioned procedure has a distribution of ±30% around the average wire size so that the distribution of the band gap of the porous Si is wide enough to the extent obtainable by combining together several different semiconductor materials having different band gaps. Moreover, the wire sizes are very fine and under complete depletion state which can be biassed to generate an avalanche effect in a certain location to make the light signal be amplified. Therefore, according to the present method, a high gain photodetector can be obtained.

To sum up, the advantages of the present porous Si photodetector include that:

1. it has a high opto-electronic conversion efficiency owing to its direct band gap;
2. it has a wide distribution of wire size, i.e. a wide distribution of band gap;
3. it has a higher light-absorbing rate owing to its porous characteristic; and
4. it has a high gain owing to the avalanche effect.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a photodetector comprising steps of:
   (a) preparing a substrate having a back surface;
   (b) coating a first metal layer on said back surface;
   (c) annealing said substrate coated with said first metal layer in an inert gas atmosphere;
   (d) applying an anti-corrosion layer on said first metal layer;
   (e) immersing said anti-corrosion layer-applied substrate in a solution;
   (f) eroding said anti-corrosion layer-applied substrate to obtain a porous layer therereon; and
   (g) applying a thin film layer of a second metal to an upper surface of said porous layer to obtain said photodetector.

2. A method according to claim 1, wherein said substrate is made of one selected from a group consisting of Si, Ge, and SiGe.

3. A method according to claim 2, wherein said substrate is P type.

4. A method according to claim 1, wherein said substrate serves as an anode.

5. A method according to claim 1, wherein said substrate has a resistivity of about 25~45 Ω-cm.

6. A method according to claim 1, wherein a crystal direction of said substrate is (100).

7. A method according to claim 1, wherein said step (b) is executed by thermal evaporation.

8. A method according to claim 1, wherein said first metal layer is made of aluminum.

9. A method according to claim 1, wherein said inert gas is nitrogen.

10. A method according to claim 1, wherein said step (c) is executed at about 350° C.–550° C.

11. A method according to claim 1, wherein said step (c) is executed for about 10 minutes.

12. A method according to claim 1, wherein said anti-corrosion layer is made of black wax.

13. A method according to claim 1, wherein said step (d) is executed by coating.

14. A method according to claim 1, wherein said solution is a hydrofluoric acid aqueous solution.

15. A method according to claim 14, wherein said hydrofluoric acid aqueous solution is in a concentration of 5%.

16. A method according to claim 1, wherein said step (f) is executed for is about 15 minutes.

17. A method according to claim 1, wherein said step (f) is executed under a current density of about 5 mA/cm$^2$.

18. A method according to claim 1, wherein wire sizes of said porous layer are different.

19. A method according to claim 1, wherein said second metal layer is made of gold.

20. A method according to claim 1, wherein said second metal layer is made of aluminum.

21. A method according to claim 1, wherein said step (f) is excuted by etching.

22. A method according to claim 1, wherein said step (g) is executed by thermal evaporation.

23. A method according to claim 1, wherein a step of depriving said anti-corrosion layer following said step (f) is excuted.

24. A method according to claim 1, wherein a step of depriving said anti-corrosion layer following said step (g) is excuted.

* * * * *